US012805210B2

(12) United States Patent
Lin

(10) Patent No.: US 12,805,210 B2
(45) Date of Patent: Nov. 17, 2026

(54) EPITAXIAL STRUCTURE AND FABRICATION METHOD OF EPITAXIAL STRUCTURE

(71) Applicant: GLOBALWAFERS CO., LTD., Hsinchu City (TW)

(72) Inventor: Po-Jung Lin, Hsinchu City (TW)

(73) Assignee: GLOBALWAFERS CO., LTD., Hsinchu City (TW)

( * ) Notice: Subject to any disclaimer, the term of this patent is extended or adjusted under 35 U.S.C. 154(b) by 399 days.

(21) Appl. No.: 18/422,973

(22) Filed: Jan. 25, 2024

(65) Prior Publication Data

US 2024/0304442 A1 Sep. 12, 2024

(30) Foreign Application Priority Data

Mar. 7, 2023 (TW) ................................ 112108343

(51) Int. Cl.
*H10P 14/20* (2026.01)
*H10D 30/47* (2025.01)
(Continued)

(52) U.S. Cl.
CPC ..... *H10P 14/3216* (2026.01); *H10D 62/8503* (2025.01); *H10P 14/24* (2026.01);
(Continued)

(58) Field of Classification Search
CPC .. H10P 14/3216; H10P 14/3416; H10P 14/32; H10D 62/8503
See application file for complete search history.

(56) References Cited

U.S. PATENT DOCUMENTS

2006/0160345 A1* 7/2006 Liu ......................... H10P 14/24
257/E21.112
2015/0221843 A1 8/2015 Choi et al.
(Continued)

FOREIGN PATENT DOCUMENTS

CN 111681953 A 9/2020
JP 2003-68660 A 3/2003
(Continued)

OTHER PUBLICATIONS

Taiwanese Search Report for Taiwanese Application No. 113109632, dated Jan. 10, 2025, with English translation.

*Primary Examiner* — Nduka E Ojeh
(74) *Attorney, Agent, or Firm* — Birch, Stewart, Kolasch & Birch, LLP

(57) ABSTRACT

A method of fabricating an epitaxial structure includes providing a silicon carbide substrate and placing the silicon carbide substrate in a growth chamber; forming a nucleation layer on a surface of the silicon carbide substrate, wherein a process gas required to grow the nucleation layer includes a first gas; a process of growing the nucleation layer includes performing a growth step; the growth step includes performing a first action and then performing a second action; the first action includes introducing the first gas into the growth chamber; the second action includes stopping introducing the first gas into the growth chamber; the growth step is repeated a plurality of times to form the nucleation layer; and forming a nitride epitaxial layer on a surface of the nucleation layer.

16 Claims, 4 Drawing Sheets

(51) Int. Cl.
*H10D 62/85* (2025.01)
*H10P 14/24* (2026.01)

(52) U.S. Cl.
CPC ...... *H10P 14/2904* (2026.01); *H10P 14/3416* (2026.01); *H10D 30/475* (2025.01)

(56) References Cited

U.S. PATENT DOCUMENTS

| | | | | |
|---|---|---|---|---|
| 2015/0279942 | A1* | 10/2015 | Yui | H10D 62/8503 257/77 |
| 2017/0213718 | A1* | 7/2017 | Sundaram | C30B 25/02 |
| 2018/0358457 | A1* | 12/2018 | Janzén | H10D 30/475 |
| 2020/0035482 | A1* | 1/2020 | Ramer | C23C 16/029 |
| 2020/0044015 | A1* | 2/2020 | Liu | H10D 62/102 |
| 2020/0071829 | A1* | 3/2020 | Maekawa | C23C 16/45553 |
| 2022/0108924 | A1* | 4/2022 | Chuang | H10P 95/11 |
| 2022/0246444 | A1* | 8/2022 | Ahmed | H10P 14/3238 |
| 2023/0360909 | A1* | 11/2023 | Lin | C23C 14/0617 |

FOREIGN PATENT DOCUMENTS

| | | | |
|---|---|---|---|
| TW | 201913740 | A | 4/2019 |
| TW | 201919238 | A | 5/2019 |

* cited by examiner

EPITAXIAL STRUCTURE AND FABRICATION METHOD OF EPITAXIAL STRUCTURE

BACKGROUND OF THE INVENTION

Technical Field

The present invention relates generally to semiconductor technology, and more particularly to an epitaxial structure and a fabrication method of an epitaxial structure.

Description of Related Art

It is known that a High Electron Mobility Transistor (HEMT) is a transistor having a two-dimensional electron gas (2-DEG), wherein the two-dimensional electron gas is located close to a heterojunction of two materials with different energy gaps. As the HEMT makes use of the 2-DEG having a high electron mobility as a carrier channel of the transistor instead of a doped region, the HEMT has features of a high breakdown voltage, the high electron mobility, a low on-resistance, and a low input capacitance, thereby being widely applied to a high power semiconductor device.

Generally, a nucleation layer is provided between an epitaxial layer of the high electron mobility transistor and a substrate to serve as a transition layer between two hetero-structures. This can relieve the problem of lattice mismatch between the epitaxial layer and the substrate, and promote the smooth two-dimensional growth of the epitaxial layer above the substrate. However, the epitaxial quality of the nucleation layer will directly affect the quality performance of the epitaxial layer. Therefore, how to provide a nucleation layer with good epitaxial quality has become a major issue in the industry.

BRIEF SUMMARY OF THE INVENTION

In view of the above, the primary objective of the present invention is to provide an epitaxial structure and a method of fabricating an epitaxial structure, which could provide a nucleation layer with good epitaxial quality.

The present invention provides a method for manufacturing an epitaxial structure, which includes: providing a silicon carbide substrate and placing the silicon carbide substrate in a growth chamber; forming a nucleation layer on a surface of the silicon carbide substrate, wherein a process gas required to grow the nucleation layer includes a first gas; a process of growing the nucleation layer includes performing a growth step, wherein the growth step includes performing a first action and then performing a second action; the first action includes introducing the first gas into the growth chamber; the second action includes stopping introducing the first gas into the growth chamber; the growth step is repeated a plurality of times to form the nucleation layer; and forming a nitride epitaxial layer on a surface of the nucleation layer.

In an embodiment, performing the growth step at one time grows the nucleation layer with a thickness of less than or equal to 2 nm.

In an embodiment, the second action includes stopping introducing the first gas into the growth chamber during a time interval; the time interval is greater than or equal to 30 seconds and is less than or equal to 180 seconds.

In an embodiment, an epitaxial growth rate of the nucleation layer is greater than or equal to 1.6 nm/min and is less than or equal to 3.5 nm/min.

In an embodiment, the process gas required to grow the nucleation layer includes a second gas; the second gas is a nitrogen-containing gas; during the process of growing the nucleation layer, the second gas is continuously introduced into the growth chamber.

In an embodiment, the first gas is an aluminum-containing gas.

In an embodiment, when performing the growth step, the growth chamber is controlled to maintain at a high temperature.

In an embodiment, the high temperature is greater than or equal to 1150 degrees Celsius and is less than or equal to 1250 degrees Celsius.

In an embodiment, the nucleation layer includes aluminum-containing nitride.

The present invention further provides an epitaxial structure, including a silicon carbide substrate; a nucleation layer, wherein the nucleation layer is located above the silicon carbide substrate and is in direct contact with the silicon carbide substrate; and a nitride epitaxial layer, wherein the nitride epitaxial layer is located above the nucleation layer and is in direct contact with the nucleation layer; wherein when a thickness of the nucleation layer is greater than or equal to 70 nm, a full width at half maximum (FWHM) of a (002) crystal plane of the nitride epitaxial layer is less than 150 arcsec.

In an embodiment, when the thickness of the nucleation layer is less than 100 nm and is greater than or equal to 70 nm, a full width at half maximum (FWHM) of a (002) crystal plane of the nucleation layer is less than 150 arcsec.

In an embodiment, under a 5 μm*5 μm scanning range of an atomic force microscope, a surface root mean square roughness (RMS) of the nucleation layer is less than 0.2 nm.

In an embodiment, a dislocation defect density of the nucleation layer is less than 108/cm$^2$.

In an embodiment, when a thickness of the nitride epitaxial layer is less than 2 μm and is greater than or equal to 1.5 μm, the full width at half maximum (FWHM) of the (002) crystal plane of the nitride epitaxial layer is less than 50 arcsec.

In an embodiment, when a thickness of the nitride epitaxial layer is less than 1.5 μm and is greater than or equal to 1 μm, the full width at half maximum (FWHM) of the (002) crystal plane of the nitride epitaxial layer is greater than or equal to 50 arcsec and less than 100 arcsec.

In an embodiment, when a thickness of the nitride epitaxial layer is less than 1 μm and is greater than or equal to 0.7 μm, the full width at half maximum (FWHM) of the (002) crystal plane of the nitride epitaxial layer is greater than or equal to 100 arcsec and is less than 150 arcsec.

In an embodiment, the nucleation layer includes aluminum-containing nitride.

The present invention further provides an epitaxial structure, including a silicon carbide substrate; a nucleation layer, wherein the nucleation layer is located above the silicon carbide substrate and is in direct contact with the silicon carbide substrate; when a thickness of the nucleation layer is less than 70 nm, a full width at half maximum (FWHM) of a (002) crystal plane of the nucleation layer is less than or equal to 200 arcsec and is greater than or equal to 150 arcsec; and a nitride epitaxial layer, wherein the nitride epitaxial layer is located above the nucleation layer and is in direct contact with the nucleation layer.

The present invention further provides an epitaxial structure, including a silicon carbide substrate; a nucleation layer, wherein the nucleation layer is located above the silicon carbide substrate and is in direct contact with the silicon carbide substrate; a thickness of the nucleation layer is greater than or equal to 70 nm; and a nitride epitaxial layer, wherein the nitride epitaxial layer is located above the nucleation layer and is in direct contact with the nucleation layer; when a thickness of the nitride epitaxial layer is less than 0.7 μm and is greater than or equal to 0.4 μm, a full width at half maximum (FWHM) of a (002) crystal plane of the nitride epitaxial layer is greater than or equal to 150 arcsec and is less than 200 arcsec.

The present invention further provides an epitaxial structure, including a silicon carbide substrate; a nucleation layer, wherein the nucleation layer is located above the silicon carbide substrate and is in direct contact with the silicon carbide substrate; a thickness of the nucleation layer is greater than or equal to 70 nm; and a nitride epitaxial layer, wherein the nitride epitaxial layer is located above the nucleation layer and is in direct contact with the nucleation layer; when a thickness of the nitride epitaxial layer is less than 0.4 μm, a full width at half maximum (FWHM) of a (002) crystal plane of the nitride epitaxial layer is greater than or equal to 200 arcsec and is less than or equal to 300 arcsec.

The effect of the present invention is that the nucleation layer grown and formed by the method of fabricating the epitaxial structure could enable the nitride epitaxial layer above the nucleation later to have good quality performance, and when the thickness of the nucleation layer is greater than or equal to 70 nm, the full width at half maximum (FWHM) of the (002) crystal plane of the nitride epitaxial layer is less than 150 arcsec.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
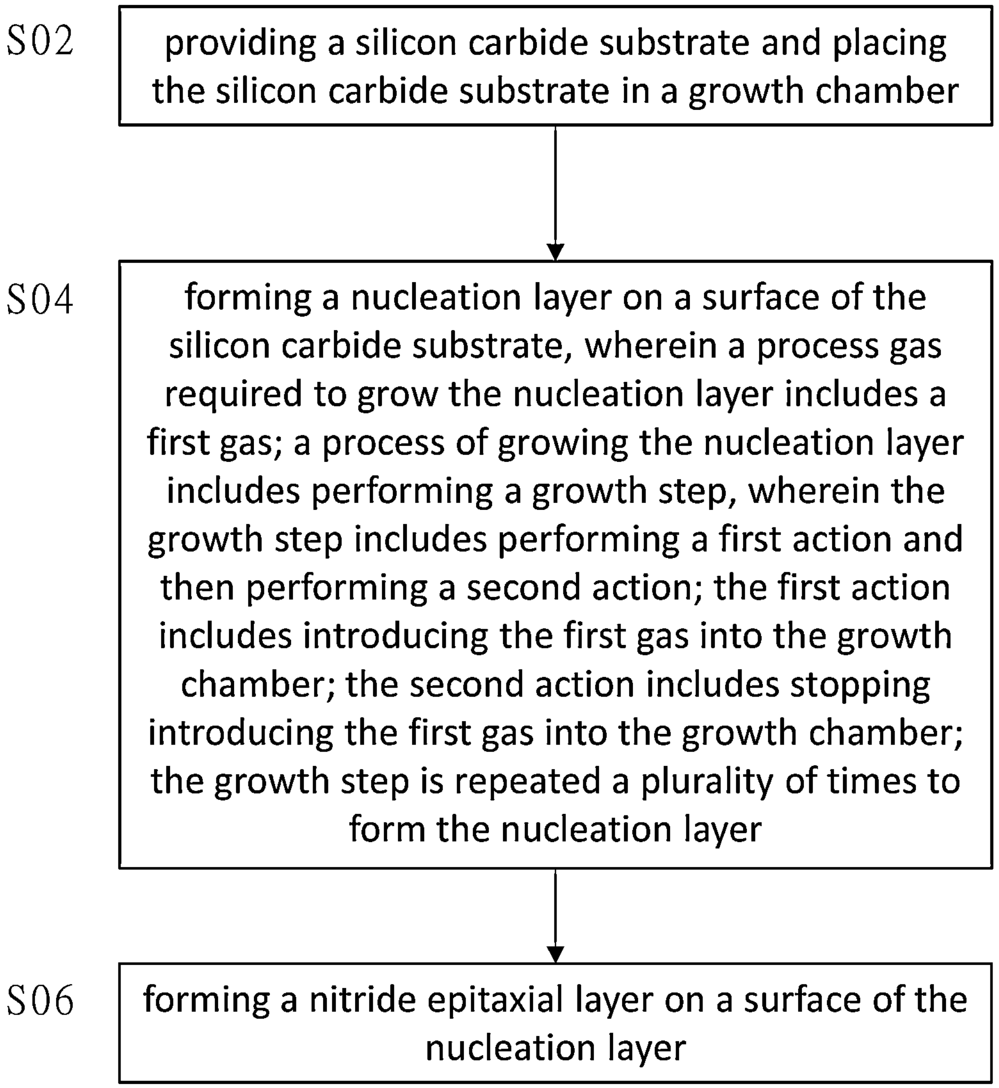
FIG. 1 is a flowchart of the method of fabricating the epitaxial structure according to an embodiment of the present invention.

A method of fabricating an epitaxial structure 1 according to an embodiment of the present invention is illustrated in FIG. 1. The method of fabricating the epitaxial structure 1 includes the following steps:

Step S02: provide a silicon carbide substrate 10 and place the silicon carbide substrate 10 in a growth chamber; the silicon carbide substrate 10 could be, for example, a silicon carbide substrate 10 with an off-angle of 4 degrees, preferably a silicon carbide substrate 10 with an off-angle of 0 degrees; furthermore, in this embodiment, an epitaxial process is performed by using Metal Organic Chemical Vapor Deposition (MOCVD), and the growth chamber is a growth chamber in a metal organic chemical vapor deposition equipment.

Figure 2:
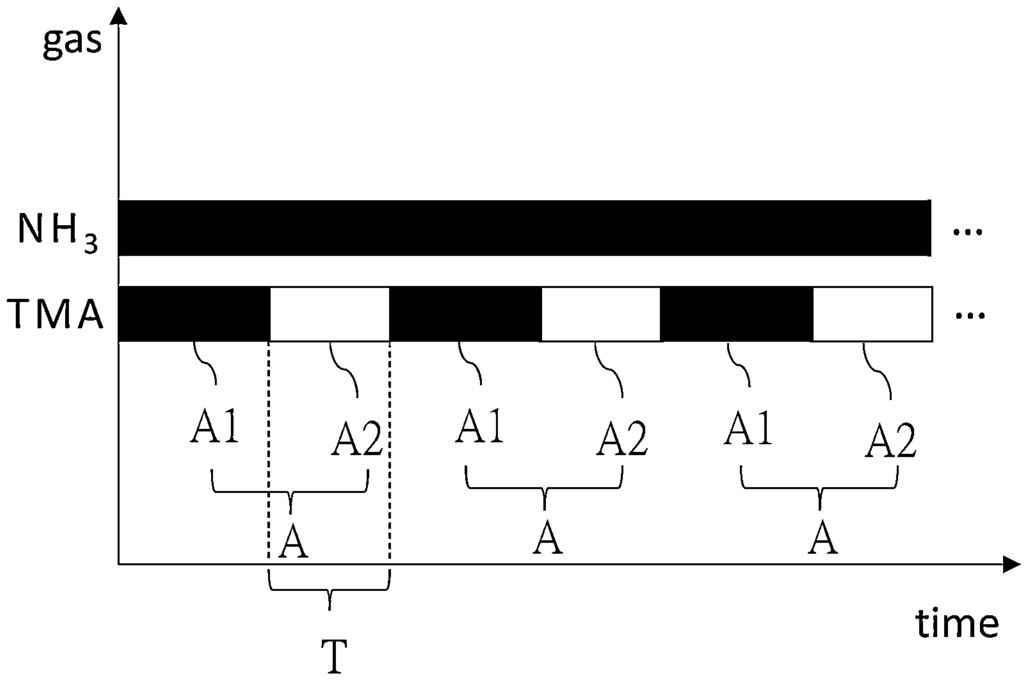
FIG. 2 is a schematic view of the gas control in the process of growing the nucleation layer according to the embodiment of the present invention.

Step S04: form a nucleation layer 20 on a surface of the silicon carbide substrate 10, wherein a process gas required to grow the nucleation layer 20 includes a first gas; in a process of growing the nucleation layer 20, the process of growing the nucleation layer 20 includes performing a growth step A; as shown in FIG. 2, the growth step A includes performing a first action A1 and then performing a second action A2; the first action A1 includes introducing the first gas into the growth chamber, and the second action A2 includes stopping introducing of the first gas into the growth chamber; the growth step A is repeated a plurality of times to form the nucleation layer 20.

The nucleation layer 20 includes aluminum-containing nitride. In this embodiment, the nucleation layer 20 includes aluminum nitride (AlN). In other embodiments, the nucleation layer 20 could further include aluminum gallium nitride (AlGaN); for example, the nucleation layer 20 could also be a superlattice layer formed by alternatively stacking aluminum nitride and aluminum gallium nitride.

The first gas is an aluminum-containing gas. In this embodiment, the first gas is illustrated with trimethylaluminum (TMA) as an example. In other embodiments, the first gas could also be triethylaluminium (TEAL). Furthermore, the process gas required to grow the nucleation layer 20 includes a second gas, wherein the second gas is a nitrogen-containing gas. During the process of growing the nucleation layer 20, the second gas is continuously introduced into the growth chamber. In this embodiment, the second gas is ammonia ($NH_3$) as an example; that is to say, during the formation of the nucleation layer 20, ammonia gas ($NH_3$) is continuously introduced into the growth chamber to prevent the nucleation layer 20 from cracking, and the introduction of trimethylaluminum and the stop of the introduction of trimethylaluminum into the growth chamber are repeatedly controlled until the nucleation layer 20 with a desired thickness is formed.

Performing the growth step A once could grow the nucleation layer 20 with a thickness of less than or equal to 2 nm. Performing the growth step A once indicates performing the first action A1 and the second action A2 once each. An epitaxial growth rate of the nucleation layer 20 is greater than or equal to 1.6 nm/min and is less than or equal to 3.5 nm/min.

Furthermore, when performing the growth step A, the growth chamber is controlled to maintain at a high temperature, wherein the high temperature is greater than or equal to 1150 degrees Celsius and is less than or equal to 1250 degrees Celsius, and a pressure of the growth chamber is controlled to remain greater than or equal to 30 torr and remain less than or equal to 150 torr; the second action A2 includes stopping introducing the first gas into the growth chamber during a time interval T, wherein the time interval T is greater than or equal to 30 seconds and is less than or equal to 180 seconds; that is to say, when the first action A1 is performed and trimethylaluminum is introduced into the growth chamber, the epitaxy of the nucleation layer 20 could be performed at the high temperature and the above-mentioned pressure of the growth chamber; when performing the second action A2 to stop introducing trimethylaluminum into the growth chamber, annealing could be performed at the same high temperature and the same pressure as above. In the conventional epitaxy method, the epitaxy of the nucleation layer is completed in one step and then the epitaxial structure is moved out of the growth chamber for one-time annealing. In comparison, by performing the growth step A multiple times and completing epitaxy and annealing in the same growth chamber, the present invention could achieve the same epitaxy quality as the conventional high-temperature, long-time epitaxy method with a shorter annealing time and a lower annealing temperature, thereby achieving the technical effect of shortening the annealing time and lowering the annealing temperature.

Step S06: form a nitride epitaxial layer 30 on a surface of the nucleation layer 20; in this embodiment, the nitride epitaxial layer 30 includes gallium nitride (GaN).

Figure 3:
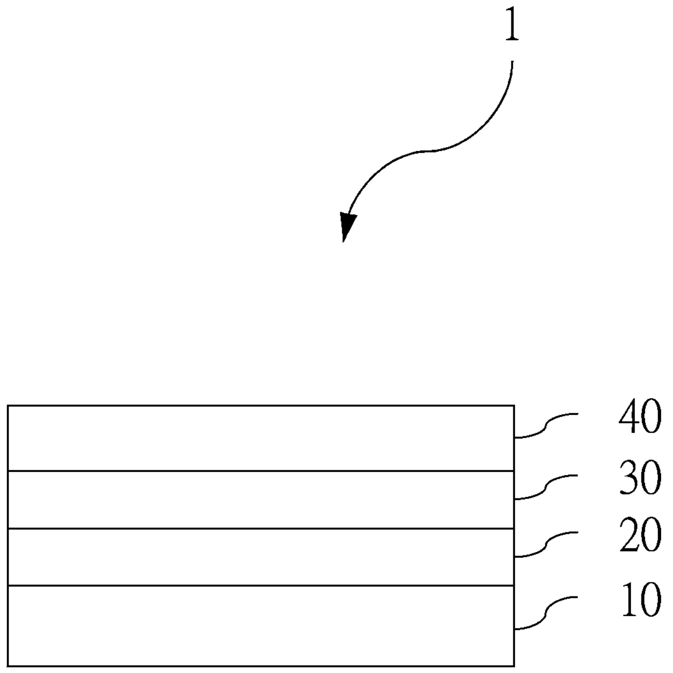
FIG. 3 is a schematic view of the epitaxial structure according to the embodiment of the present invention.

Referring to FIG. 3, the epitaxial structure 1 fabricated by using the method of fabricating the epitaxial structure 1 includes the silicon carbide substrate 10, the nucleation layer 20, and the nitride epitaxial layer 30, wherein the epitaxial structure 1 could be applied to a high electron mobility transistor, and other structures, such as a barrier layer 40, could be further grown above the nitride epitaxial layer 30.

As shown in FIG. 3, the nucleation layer 20 is located above the silicon carbide substrate 10 and is in direct contact with the silicon carbide substrate 10. The nitride epitaxial layer 30 is located above the nucleation layer 20 and is in direct contact with the nucleation layer 20. When the thickness of the nucleation layer 20 is greater than or equal to 70 nm, a full width at half maximum (FWHM) of a (002) crystal plane of the nitride epitaxial layer 30 measured by an X-ray diffractometer (XRD) is less than 150 arcsec. Thus, the nitride epitaxial layer 30 of the epitaxial structure 1 fabricated by using the method of fabricating the epitaxial structure 1 has a good epitaxial quality.

When the thickness of the nucleation layer 20 is less than 100 nm and is greater than or equal to 70 nm, the full width at half maximum (FWHM) of the (002) crystal plane of the nucleation layer 20 is less than 150 arcsec; when the thickness of the nucleation layer 20 is less than 70 nm, the full width at half maximum (FWHM) of the (002) crystal plane of the nucleation layer 20 is less than or equal to 200 arcsec and is greater than or equal to 150 arcsec.

When the thickness of the nucleation layer 20 is greater than or equal to 70 nm and a thickness of the nitride epitaxial layer 30 is less than 2 μm and is greater than or equal to 1.5 μm, a full width at half maximum (FWHM) of a (002) crystal plane of the nitride epitaxial layer 30 is less than 50 arcsec; when the thickness of the nucleation layer 20 is greater than or equal to 70 nm and the thickness of the nitride epitaxial layer 30 is less than 1.5 μm and is greater than or equal to 1 μm, the full width at half maximum (FWHM) of the (002) crystal plane of the nitride epitaxial layer 30 is greater than or equal to 50 arcsec and is less than 100 arcsec; when the thickness of the nucleation layer 20 is greater than or equal to 70 nm and the thickness of the nitride epitaxial layer 30 is less than 1 μm and is greater than or equal to 0.7 μm, the full width at half maximum (FWHM) of the (002) crystal plane of the nitride epitaxial layer 30 is greater than or equal to 100 arcsec and is less than 150 arcsec; when the thickness of the nucleation layer 20 is greater than or equal to 70 nm and the thickness of the nitride epitaxial layer 30 is less than 0.7 μm and is greater than or equal to 0.4 μm, the full width at half maximum (FWHM) of the (002) crystal plane of the nitride epitaxial layer 30 is greater than or equal to 150 arcsec and is less than 200 arcsec; when the thickness of the nucleation layer 20 is greater than or equal to 70 nm and the thickness of the nitride epitaxial layer 30 is less than 0.4 μm, the full width at half maximum (FWHM) of the (002) crystal plane of the nitride epitaxial layer 30 is greater than or equal to 200 arcsec and is less than or equal to 300 arcsec.

Under a 5 μm*5 μm scanning range of an atomic force microscope, a surface root mean square roughness (RMS) of the nucleation layer 20 is less than 0.2 nm; a dislocation defect density of the nucleation layer 20 is less than 108/cm$^2$.

The following is further described with comparative examples 1-3 and examples 1-3, wherein epitaxial structures 1 of the examples 1-3 are fabricated by using the method of fabricating the epitaxial structure, wherein the nitride epitaxial layer 30 of the epitaxial structure 1 of each of the examples 1-3 are measured by using an X-ray diffractometer (XRD). The epitaxial structure 1 includes the silicon carbide substrate 10, the nucleation layer 20, the nitride epitaxial layer 30 and the barrier layer 40 in sequence as described above. Further, performing the growth step A could grow the nucleation layer 20 with a thickness of 1 nm at a time, and when performing the growth step A, the growth chamber is controlled to maintain the high temperature of 1170 degrees Celsius and the pressure of 75 torr. The epitaxial structures 1 of the examples 1-3 all have a nucleation layer 20 with a thickness of 90 nm and a full width at half maximum (FWHM) of the (002) crystal plane equal to 100 arcsec. The difference among the epitaxial structures 1 of the examples 1-3 lies in the thickness of the nitride epitaxial layer 30. In the example 1, the thickness of the nitride epitaxial layer 30 is 1 μm; in the example 2, the thickness of the nitride epitaxial layer 30 is 0.7 μm; in the example 3, the thickness of the nitride epitaxial layer 30 is 0.4 μm.

Epitaxial structures of the comparative examples 1-3 are fabricated by using a conventional epitaxial method, wherein the nitride epitaxial layer of the epitaxial structure of each of the comparative examples 1-3 are measured by using an X-ray diffractometer (XRD). The epitaxial structure fabricated by using the conventional epitaxial method similarly includes a silicon carbide substrate, a nucleation layer, a nitride epitaxial layer, and a barrier layer in sequence. The difference between the conventional epitaxial method and the method of fabricating the epitaxial structure of the present invention is that when forming the nucleation layer, the conventional epitaxial method first completes the epitaxial growth of the nucleation layer, then moves the epitaxial structure out of the growth chamber for annealing, and then continues to form the nitride epitaxial layer above the nucleation layer. The epitaxial structures of the comparative examples 1-3 all have a nucleation layer with a thickness of 90 nm and a full width at half maximum (FWHM) of a (002) crystal plane equal to 300 arcsec. The epitaxial structures of the comparative examples 1-3 are different regarding to the thickness of the nitride epitaxial layer, wherein in the comparative example 1, the thickness of the nitride epitaxial layer is 2 μm; in the comparative example 2, the thickness of the nitride epitaxial layer is 1.5 μm; in the comparative example 3, the thickness of the nitride epitaxial layer is 1 μm.

Figure 4:
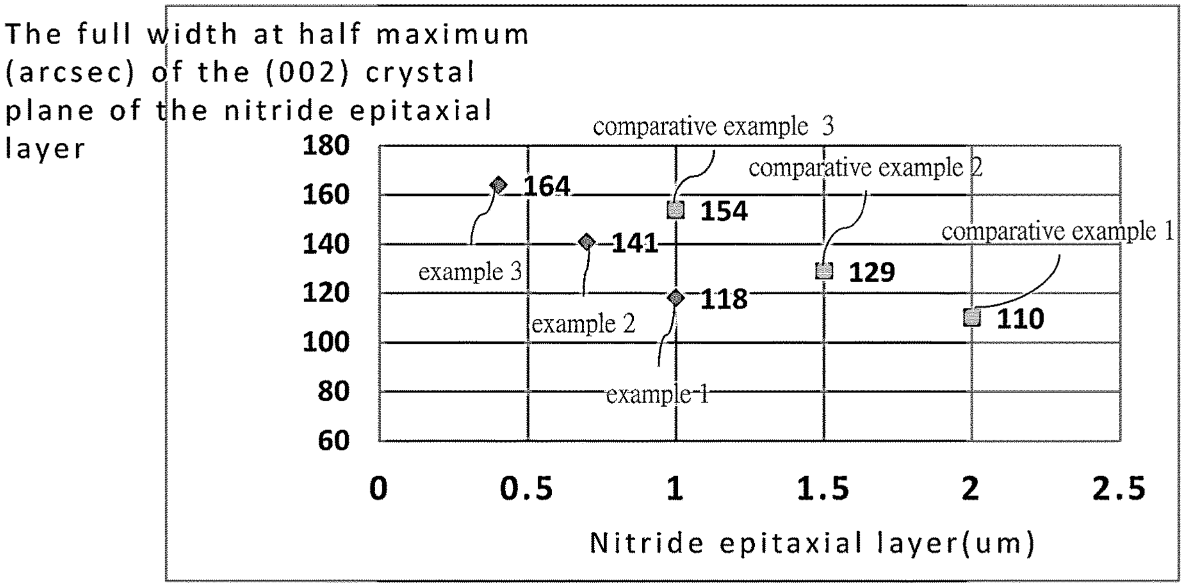
FIG. 4 is a graph showing the thickness and full width at half maximum of the nitride epitaxial layer of the examples 1-3 and the comparative examples 1-3.

As shown in FIG. 4, when the thickness of the nitride epitaxial layer 30 is thicker, the full width at half maximum (FWHM) of the (002) crystal plane of the nitride epitaxial layer 30 has a better epitaxial quality regardless of the comparative examples 1-3 and the examples 1-3. Through the comparison between the comparative example 3 and the example 1, it can be known that although the comparative example 3 and the example 1 have the nitride epitaxial layer with the same thickness, the full width at half maximum (FWHM) of the (002) crystal plane of the nitride epitaxial layer 30 of the example 1 is 118 arcsec, and the full width at half maximum (FWHM) of the (002) crystal plane of the nitride epitaxial layer of the comparative example 3 is 154 arcsec. In other words, compared with the comparative example 3, the nitride epitaxial layer 30 of the example 1 has a better epitaxial quality. In addition, it can be inferred that in order to achieve a better epitaxial quality, the epitaxial structure fabricated by the conventional epitaxial method needs to grow thicker; however, the epitaxial structure fabricated by the method of fabricating the epitaxial structure of the present invention could achieve the same epitaxial quality by growing the nitride epitaxial layer with a thinner thickness.

With the aforementioned design, the nucleation layer 20 grown and formed by using the method of fabricating the epitaxial structure of the present invention could make the nitride epitaxial layer 30 above the nucleation layer 20 have a better quality performance.

It must be pointed out that the embodiments described above are only some preferred embodiments of the present invention. All equivalent structures and methods which employ the concepts disclosed in this specification and the appended claims should fall within the scope of the present invention.

What is claimed is:

1. A method of fabricating an epitaxial structure, comprising:

providing a silicon carbide substrate and placing the silicon carbide substrate in a growth chamber;

forming a nucleation layer on a surface of the silicon carbide substrate, wherein a process gas required to grow the nucleation layer includes a first gas; a process of growing the nucleation layer includes performing a growth step, wherein the growth step includes performing a first action and then performing a second action; the first action includes introducing the first gas into the growth chamber; the second action includes stopping introducing the first gas into the growth chamber; the growth step is repeated a plurality of times to form the nucleation layer; and forming a nitride epitaxial layer on a surface of the nucleation layer;

wherein when performing the growth step, the growth chamber is controlled to maintain at a high temperature;

wherein the high temperature is greater than or equal to 1150 degrees Celsius and is less than or equal to 1250 degrees Celsius.

2. The method as claimed in claim 1, wherein performing the growth step at one time grows the nucleation layer with a thickness of less than or equal to 2 nm.

3. The method as claimed in claim 1, wherein the second action includes stopping introducing the first gas into the growth chamber during a time interval; the time interval is greater than or equal to 30 seconds and is less than or equal to 180 seconds.

4. The method as claimed in claim 1, wherein an epitaxial growth rate of the nucleation layer is greater than or equal to 1.6 nm/min and is less than or equal to 3.5 nm/min.

5. The method as claimed in claim 1, wherein the process gas required to grow the nucleation layer includes a second gas; the second gas is a nitrogen-containing gas; during the process of growing the nucleation layer, the second gas is continuously introduced into the growth chamber.

6. The method as claimed in claim 1, wherein the first gas is an aluminum-containing gas.

7. The method as claimed in claim 1, wherein the nucleation layer includes aluminum-containing nitride.

8. An epitaxial structure, comprising:

a silicon carbide substrate;

a nucleation layer, wherein the nucleation layer is located above the silicon carbide substrate and is in direct contact with the silicon carbide substrate; and a nitride epitaxial layer, wherein the nitride epitaxial layer is located above the nucleation layer and is in direct contact with the nucleation layer;

wherein when a thickness of the nucleation layer is greater than or equal to 70 nm, a full width at half maximum (FWHM) of a (002) crystal plane of the nitride epitaxial layer is less than 150 arcsec.

9. The epitaxial structure as claimed in claim 8, wherein when the thickness of the nucleation layer is less than 100 nm and is greater than or equal to 70 nm, a full width at half maximum (FWHM) of a (002) crystal plane of the nucleation layer is less than 150 arcsec.

10. The epitaxial structure as claimed in claim 8, wherein under a 5 μm*5 μm scanning range of an atomic force microscope, a surface root mean square roughness (RMS) of the nucleation layer is less than 0.2 nm.

11. The epitaxial structure as claimed in claim 8, wherein a dislocation defect density of the nucleation layer is less than 108/cm2.

12. The epitaxial structure as claimed in claim 8, wherein when a thickness of the nitride epitaxial layer is less than 2 μm and is greater than or equal to 1.5 μm, the full width at half maximum (FWHM) of the (002) crystal plane of the nitride epitaxial layer is less than 50 arcsec.

13. The epitaxial structure as claimed in claim 8, wherein when a thickness of the nitride epitaxial layer is less than 1.5 μm and is greater than or equal to 1 μm, the full width at half maximum (FWHM) of the (002) crystal plane of the nitride epitaxial layer is greater than or equal to 50 arcsec and less than 100 arcsec.

14. The epitaxial structure as claimed in claim 8, wherein when a thickness of the nitride epitaxial layer is less than 1 μm and is greater than or equal to 0.7 μm, the full width at half maximum (FWHM) of the (002) crystal plane of the nitride epitaxial layer is greater than or equal to 100 arcsec and is less than 150 arcsec.

15. The epitaxial structure as claimed in claim 8, wherein the nucleation layer includes aluminum-containing nitride.

16. An epitaxial structure, comprising:

a silicon carbide substrate;

a nucleation layer, wherein the nucleation layer is located above the silicon carbide substrate and is in direct contact with the silicon carbide substrate; a thickness of the nucleation layer is greater than or equal to 70 nm; and a nitride epitaxial layer, wherein the nitride epitaxial layer is located above the nucleation layer and is in direct contact with the nucleation layer; when a thickness of the nitride epitaxial layer is less than 0.7 μm and is greater than or equal to 0.4 μm, a full width at half maximum (FWHM) of a (002) crystal plane of the nitride epitaxial layer is greater than or equal to 150 arcsec and is less than 200 arcsec.

* * * * *